United States Patent
Miettinen et al.

(10) Patent No.: US 10,443,142 B2
(45) Date of Patent: Oct. 15, 2019

(54) METHOD FOR PRODUCING CHROMIUM-CONTAINING MULTILAYER COATING AND A COATED OBJECT

(71) Applicant: Savroc Ltd, Kuopio (FI)

(72) Inventors: Juha Miettinen, Hiltulanlahti (FI); Jussi Räisä, Kuopio (FI)

(73) Assignee: Savroc Ltd, Kuopio (FI)

( * ) Notice: Subject to any disclaimer, the term of this patent is extended or adjusted under 35 U.S.C. 154(b) by 4 days.

(21) Appl. No.: 15/111,594

(22) PCT Filed: Jan. 15, 2014

(86) PCT No.: PCT/FI2014/050030
§ 371 (c)(1),
(2) Date: Jul. 14, 2016

(87) PCT Pub. No.: WO2015/107255
PCT Pub. Date: Jul. 23, 2015

(65) Prior Publication Data
US 2016/0333493 A1    Nov. 17, 2016

(51) Int. Cl.
*C25D 11/36* (2006.01)
*C23C 28/00* (2006.01)
(Continued)

(52) U.S. Cl.
CPC ............... *C25D 5/14* (2013.01); *C23C 14/24* (2013.01); *C23C 16/44* (2013.01);
(Continued)

(58) Field of Classification Search
CPC .................... C25D 3/562; C25D 11/36; C23C 28/40–28/42; C22F 1/10–1/11
See application file for complete search history.

(56) References Cited

U.S. PATENT DOCUMENTS 2,859,158 A * 11/1958 Schaer ................... C25D 5/14
                                                             205/180
3,164,897 A    1/1965 Patriarca et al.
(Continued)

FOREIGN PATENT DOCUMENTS

CN        1099432 A      3/1995
CN        1497065 A      5/2004
(Continued)

OTHER PUBLICATIONS

Mu, S. et al., "Investigation of a transparent chromate (III) passive film on electroless Ni—P coating by XPS and electrochemical methods," Electrochimica Acta, vol. 54 (2009), pp. 6718-6724.
(Continued)

*Primary Examiner* — Bryan D. Ripa
*Assistant Examiner* — Ho-Sung Chung
(74) *Attorney, Agent, or Firm* — Ware, Fressola, Maguire & Barber LLP (57) ABSTRACT

To produce a chromium-containing multilayer coating on an object, alternate layers of nickel phosphorus alloy and trivalent chromium are deposited on the object until a desired thickness of coating has been reached. The coated object is then subjected to one or more heat treatments to improve the mechanical and physical properties of the coating and to produce multiphase layers comprising layers containing crystalline Ni and crystalline $Ni_3P$ and layers containing crystalline Cr.

19 Claims, 5 Drawing Sheets

(51) Int. Cl.
  C22F 1/10     (2006.01)
  C22F 1/11     (2006.01)
  C25D 5/14     (2006.01)
  C25D 3/06     (2006.01)
  C25D 5/50     (2006.01)
  C23C 28/02    (2006.01)
  C25D 3/56     (2006.01)
  C23C 14/24    (2006.01)
  C23C 16/44    (2006.01)
  C23C 16/455   (2006.01)
  C23C 18/16    (2006.01)
  C23C 18/32    (2006.01)

(52) U.S. Cl.
  CPC .... *C23C 16/45525* (2013.01); *C23C 18/1653* (2013.01); *C23C 18/1692* (2013.01); *C23C 18/32* (2013.01); *C23C 28/02* (2013.01); *C23C 28/021* (2013.01); *C23C 28/023* (2013.01); *C23C 28/42* (2013.01); *C25D 3/06* (2013.01); *C25D 3/562* (2013.01); *C25D 5/50* (2013.01)

(56) References Cited

U.S. PATENT DOCUMENTS

| | | | |
|---|---|---|---|
| 4,461,680 | A | 7/1984 | Lashmore |
| 5,232,469 | A | 8/1993 | McEachron et al. |
| 5,252,360 | A * | 10/1993 | Huettl et al. ............ C23C 16/00 427/255.2 |
| 5,271,823 | A | 12/1993 | Schachameyer et al. |
| 5,413,646 | A | 5/1995 | Dash et al. |
| 6,846,367 | B2 | 1/2005 | Nam et al. |
| 7,910,231 | B2 | 3/2011 | Schuh et al. |
| 9,347,145 | B2 | 5/2016 | Bessho |
| 2005/0249927 | A1 | 11/2005 | Suzuki et al. |
| 2009/0211914 | A1 | 8/2009 | Huang et al. |
| 2010/0025255 | A1 | 2/2010 | Su et al. |
| 2012/0111613 | A1 | 5/2012 | Oguro et al. |
| 2015/0132604 | A1* | 5/2015 | Sue ........................ E21B 4/02 428/664 |
| 2015/0361571 | A1 | 12/2015 | Miettinen et al. |
| 2016/0333493 | A1 | 11/2016 | Miettinen et al. |
| 2016/0333494 | A1 | 11/2016 | Miettinen et al. |
| 2017/0159198 | A1 | 6/2017 | Miettinen et al. |

FOREIGN PATENT DOCUMENTS

| | | |
|---|---|---|
| CN | 101078132 A | 11/2007 |
| CN | 101397685 A | 4/2009 |
| CN | 101512047 A | 8/2009 |
| CN | 101855388 A | 10/2010 |
| CN | 102196675 | 9/2011 |
| CN | 102471913 A | 5/2012 |
| CN | 102644067 A | 8/2012 |
| CN | 102906311 A | 1/2013 |
| CN | 103132114 A | 6/2013 |
| CN | 103255454 A | 8/2013 |
| EP | 0446762 | 9/1991 |
| GB | 921977 | 3/1963 |
| JP | S54124831 | 9/1979 |
| JP | S60013094 | 1/1985 |
| JP | 360196209 A | 10/1985 |
| JP | H04214875 | 8/1992 |
| JP | H06248472 | 9/1994 |
| JP | H09095793 | 4/1997 |
| JP | S63203792 | 8/1998 |
| JP | 2002285375 | 10/2002 |
| JP | 2005206915 A | 8/2005 |
| JP | 2007023316 A | 2/2007 |
| JP | 2011179078 | 9/2011 |
| JP | 2013091811 A | 5/2013 |
| SE | 205488 | 6/1966 |
| WO | 2007007790 | 1/2007 |
| WO | 2011105392 | 9/2011 |
| WO | 2014111616 | 7/2014 |

OTHER PUBLICATIONS

Benaben, Patrick, "An Overview of Hard Chromium Plating Using Trivalent Chromium Solutions", https://www.pfonline.com/articles/an-overview-of-hard-chromium-plating-using-trivalent-chromium-solutions, Jan. 31, 2011 (12 pages).

Zhang, et al., "Practical Electroplating Additive," Ed. 1, pp. 451-460, Chemical Industry Press, 2007.

William Blum, et al., "Protective Value of Nickel and Chromium Plating on Steel," Part of Journal of Research of the National Bureau of Standards, vol. 13, pp. 331-355, Sep. 1934.

Ching An Huang, et al., "Hardness variation and corrosion behavior of as-plated and annealed Cr—Ni alloy deposits electroplated in a trivalent chromium-based bath," 203 Surface & Coatings Technology 3686-3691, Jun. 6, 2009.

Ching An Huang, et al., "Microstructure analysis of a Cr—Ni multilayer pulse-electroplated in a bath containing trivalent Chromium and divalent nickel ions," 255 Surface & Coatings Technology 153-157, Apr. 8, 2014.

Jingli Fang, "Electroplating Coordination Compound-Theory and Application," pp. 504-508, 511-514, Chemical Industry Press, 2008.

Stadnik, Z.M., et al., "Magnetic properties and 61Ni Mössbauer spectroscopy of the ternary phosphide CrNiP", 20 Journal of Physics: Condensed Matter, Jun. 14, 2008.

Official Journal of the European Union, "Directive 2002/95/EC of the European Parliament and of the Council of Jan. 27, 2003 on the restriction of the use of certain hazardous substances in electrical and electronic equipment", Feb. 13, 2003 (258 pages).

Roshan Chapaneri, "A study of hexavalent and trivalent chromium conversion coatings on zinc surfaces", Mar. 2010 (18 pages).

Lanxess Deutschland GmbH et al., "Analysis of Alternatives", Sep. 2016, available at https://echa.europa.eu/documents/10162/70ae9192-4c86-4e68-9021-0a9017b56444 (180 pages).

* cited by examiner

METHOD FOR PRODUCING CHROMIUM-CONTAINING MULTILAYER COATING AND A COATED OBJECT

FIELD OF THE INVENTION

The invention relates to a method for producing a chromium-containing multilayer coating on an object. The invention also relates to a coated object produced by said method.

BACKGROUND OF THE INVENTION

Chromium coating is widely used as a surface coating for metal articles because of its high hardness value, attractive appearance and superior wear and corrosion resistance. Traditionally, chromium deposition is accomplished by electrodeposition from a chromium plating bath containing hexavalent chromium ions as a source of chromium. The process is highly toxic in nature. Lots of efforts have been made to develop alternative coatings and coating processes to replace the use of hexavalent chromium in electroplating. Among those alternative processes, trivalent chromium electroplating seems to be attractive due to convenience of fabrication through the use of environmental friendly and non-toxic chemicals and ability to produce a bright chromium deposit. However, an industrial scale process giving a hard and corrosion resistant chromium deposit through an aqueous trivalent chromium solution is still missing. Among the industry, there is a hectic need for a well manageable and easy to use chromium based coating process to replace the current use of hexavalent chromium in coating.

Decorative chrome is designed to be aesthetically pleasing and durable. The thickness of decorative chromium coating is generally between 0.05 and 0.5 µm. There has been a strong movement away from hexavalent decorative chromium baths to new trivalent chromium baths. The trivalent form of chromium is considered to be less toxic.

Hard chrome is used to reduce friction, improve durability through abrasion tolerance and wear resistance, minimize galling or seizing of parts, expand chemical inertness to include a broader set of conditions, and as bulking material for worn parts to restore their original dimensions. Hard chromium coatings tend to be thicker than decorative chromium coatings. The thickness of hard chrome can be as high as 200-600 µm. Due to its thickness, the hardness of hard chrome is usually over 700 HV. Today, hard chrome is almost exclusively electroplated from hexavalent chromium baths because of difficulties in reaching desired wear resistance and hardness by using trivalent chromium baths.

Many chromium plating processes of prior art are not capable of producing coatings with a Vickers microhardness value of 2000 HV or more. Further defects of the known chromium-based coatings are their inadequate wear and corrosion resistances. Chromium coating as such is very brittle in character. The number of cracks and microcracks in a chromium coating increases together with the thickness of the coating, thus impairing the corrosion resistance of the coating.

Deposition of nickel, either by electroless plating or electroplating, has also been proposed as an alternative to hard chrome. Drawbacks of nickel plating include deficiencies in hardness, friction coefficient, wear resistance, corrosion resistance and adhesion. Nickel plating and hard chrome are not interchangeable coatings. The two have unique deposit properties and, therefore, each has its distinct applications.

In the prior art, several attempts have been made to improve the corrosion resistance of an object by multi-layer coating. However, relatively little success has been reported on improvement of abrasive wear resistance produced by multi-layer coating.

U.S. Pat. No. 2,859,158 discloses a process for coating molybdenum with a nickel-chromium diffusion alloy. The process consists of depositing sequentially a layer of chromium and a layer of nickel, repeating said sequence of depositions a plurality of times, and heating the coated molybdenum for 4 hours at a temperature above 980° C. and substantially below the melting point of the eutectic of the metals. Chromium layers are deposited from hexavalent chromium bath. The use of hexavalent chromium in electroplating is something that should be avoided today. The heat treatment carried out after coating is quite harsh. The method is suitable only for coating of molybdenum.

SE 205488 discloses a coating for an article of ferroalloy, comprising alternating layers of nickel and chromium, the lowermost layer being of nickel and the topmost layer being either of nickel or chromium. Chromium is deposited from hexavalent chromium containing electroplating bath.

US 2010/0025255 discloses an electroplating method for magnesium and magnesium alloy substrate. The method comprises chemically plating the substrate to form a nickel coating on its surface and electroplating the substrate to form, in order, a first nickel coating, a copper coating, a second nickel coating and a chromium coating on the chemically produced nickel coating.

Apparently, there is a need for a chromium-based coating which is able to yield such utmost mechanical properties that enable replacement of hexavalent chromium baths.

PURPOSE OF THE INVENTION

The purpose of the invention is to eliminate, or at least reduce, the problems faced in the prior art. One purpose of the invention is to avoid the use of hexavalent chromium.

More precisely, a purpose of the invention is to provide an environmentally friendly method for producing chromium-containing multilayer coatings having improved properties, such as a good sliding wear resistance and an improved corrosion resistance.

SUMMARY

The coating method according to the present invention is characterized by what is presented in claim 1.

The coated object according to the present invention is characterized by what is presented in claim 16.

The method for producing a chromium-containing multilayer coating on an object comprises depositing a layer of nickel-phosphorus alloy (NiP) on the object, electroplating a layer of trivalent chromium on the object, repeating said steps one or more times in order to produce a multilayer coating containing two or more alternate layers of nickel-phosphorus alloy and chromium, and subjecting the coated object to one or more heat treatments to amend the mechanical and physical properties of the coating and to produce multiphase layers containing crystalline Ni and crystalline $Ni_3P$ and multiphase layers containing crystalline Cr.

In this connection, the wording "electroplating a layer of trivalent chromium" is used to define a process step in which a chromium layer is deposited from an electrolytic bath in which chromium is present only in the trivalent form.

According to one embodiment of the present invention, at least one of the chromium layers is deposited next to a NiP layer and during the heat treatment at least one multiphase layer is produced that contains crystalline CrNi.

According to one embodiment of the present invention, at least one intermediate layer is deposited on the object between the layers of NiP and Cr, the intermediate layer consisting of a metal or metal alloy other than NiP or Cr. The intermediate layer can consist of, for instance, nickel, copper or molybdenum, or an alloy containing any of them. Alternatively, the intermediate layer can consist of ceramic, such as titanium nitride or chromium nitride, or diamond like carbon.

According to one embodiment of the present invention, a strike layer is deposited between the layers of chromium and NiP. A strike layer can be used to improve the adhesion between two layers. The strike layer can consist of, for instance, sulphamate nickel, bright nickel, titanium, or any other suitable material.

The NiP layers can be produced by electrodeposition (electroplating) or electroless deposition (chemical deposition). The phosphorus content of the nickel phosphorus alloy can be 1-15 w-%, preferably 3-12 w-%, more preferably 5-9 w-%.

The temperature in the heat treatments can be 200-1000° C., preferably 400-750° C., more preferably 500-700° C.

According to one embodiment of the present invention, at least two heat treatments are carried out after the desired number of coating layers has been deposited on the object. The coated object is cooled between successive heat treatments.

According to one embodiment of the present invention, at least one of the heat treatments is carried out at a temperature between 500 and 700° C.

According to one embodiment of the present invention, the object to be coated is of metal and the hardening of the metal of the object is carried out at the same time as the coated object is heat-treated.

In one embodiment of the invention, the metal object is of steel and the heat treatment is carried out at a temperature between 750 and 1000° C.

In case the hardening of a metal object is carried out in connection with a heat treatment of the coated object, it is possible to subsequently subject the object to annealing or tempering in a second heat treatment, which is carried out after quenching.

It is also possible to subject an already hardened metal object to a further hardening during the heat treatment of the coated object even though the metal object had originally been hardened before the coating.

According to one embodiment of the present invention, the method further comprises depositing a top layer on the coated and heat-treated object by thin film deposition, such as physical vapor deposition (PVD), chemical vapor deposition (CVD) or atomic layer deposition (ALD). The top layer can be made of any suitable material that is able to give the coated surface the desired properties. Suitable materials comprise, for instance, metals, metal alloys, ceramics, nitrides (TiN, CrN), and diamond like carbon (DLC).

Alternatively, it is possible to produce a thin film deposited top layer on the coated object before a heat treatment.

The coated object according to the present invention comprises multiphase layers containing crystalline Ni and crystalline $Ni_3P$ and multiphase layers containing crystalline Cr.

In one embodiment of the invention, the coated object further comprises at least one multiphase layer containing crystalline CrNi.

In one embodiment of the invention, the coated object further comprises at least one intermediate layer consisting of a metal or metal alloy other than NiP or Cr. The intermediate layer can consist of, for instance, nickel, copper, and/or molybdenum, or an alloy containing any of them.

In one embodiment of the present invention, the coated object further comprises a top layer produced by thin film deposition, such as physical vapor deposition (PVD), chemical vapor deposition (CVD) or atomic layer deposition (ALD). The top layer can consist of, for instance, metal, metal alloy, ceramic, such as titanium nitride (TiN) or chromium nitride (CrN), or diamond like carbon (DLC).

By means of the method according to the present invention it is possible to produce chromium-containing multilayer coatings having excellent mechanical and physical properties. The coating is hard, dense and ductile, and it has superior wear and corrosion resistances. The coating method is environmentally friendly and enables production of thick chromium-containing coatings with lesser amount of cracks and micro-cracks when compared to conventional chromium coatings.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention.

FIG. 4a is a SEM micrograph corresponding to FIG. 3a.

DETAILED DESCRIPTION OF THE INVENTION

The new coating method can be used to produce chromium based multilayer coatings on objects of different materials, such as different metals, plastic, ceramic, etc. The new coating can be used to replace decorative chrome or hard chrome coatings.

The object to be coated is first subjected to suitable pretreatment steps, such as chemical and/or electrolytic degreasing to remove oil and dirt from the surface to be coated, pickling or etching to activate the surface to be coated, and rinsing as often needed. Some of these treatments can be repeated between subsequent coating steps.

A layer of nickel phosphorus alloy (NiP) can be deposited on the pretreated object by electroplating, that is, electrical deposition from an electrolytic bath containing salts of nickel and phosphorus.

Alternatively, NiP can be chemically deposited on the pretreated object (electroless deposition), for instance, from a solution formulated with sodium hypophosphite as reducing agent. The result is a nickel film alloyed with phosphorus. The nickel phosphorus alloy can comprise 1-15 w-%, preferably 3-12 w-%, more preferably 5-9 w-% phosphorus. The thickness of the NiP layer can be 0.05-80 μm, preferably 0.5-30 μm.

A chromium layer can be deposited on the NiP layer by electroplating from a trivalent chromium containing bath. The chromium electroplating step can be carried out using any commercially available Cr(III) bath. One example of an electrolyte solution that has been used in the trivalent chromium coating step is the one sold by Atotech Deutchland GmbH under trade name Trichrome Plus®. This electrolyte solution comprises 20-23 g/l trivalent chromium ions and 60-65 g/l boric acid. The working parameters of the process are: pH 2.7-2.9, temperature 30-43° C. and cathodic current density 8-11 A/dm². In the Trichrome Plus process, graphite anodes are used and additives are involved to prevent oxidation of trivalent chromium at the anodes. The thickness of the chromium layer deposited on the NiP layer can be 0.05-20 μm, preferably 1-10 μm.

After depositing a layer of NiP and a layer of Cr on the object, the steps of NiP deposition and Cr deposition can be repeated as many times as needed to reach the desired thickness of the coating and/or the desired number of coating layers. If appropriate, the coated surface can be activated between subsequent coating steps.

It is also possible to deposit a strike layer on the chromium layer prior to depositing the next NiP layer. A strike layer ensures good adherence of NiP to the chromium layer. To produce a nickel strike layer, the object is immersed into a nickel salt-containing bath, through which an electric current is passed, resulting in the deposition of a nickel layer on the substrate. For instance, a nickel strike layer can be electroplated on the object from a nickel sulphamate bath before the electroless deposition of nickel phosphorus alloy. The thickness of the nickel strike layer can be, for instance, in the range of 0.1-10 μm.

It is also possible to deposit an intermediate layer of another metal or metal alloy on the object between the depositing the layers of NiP and Cr. Suitable metals for the intermediate layer comprise, for instance, but not exclusively, copper, molybdenum, nickel and alloys containing them.

After the desired number of coating layers has been deposited on the object, the coated object is subjected to one or more heat treatments, the purpose of which is to improve the physical and mechanical properties of the multilayer coating. In some cases, a further purpose of the heat treatment can be to harden the metal object under the coating.

Heat treatments can be carried out at a temperature between 200-1000° C., preferably 400-750° C., more preferably 500-700° C. Preferably, the process comprises two or more successive heat treatments and the coated object is cooled between the heat treatments. Heat treatments can be carried out, for instance, in a conventional gas furnace, in which case the duration of one heat treatment can be 20-60 minutes. Alternatively, heat treatments can be carried out by induction, flame heating, or laser heating. Induction heating is a no-contact process that quickly produces intense, localized and controllable heat. With induction, it is possible to heat only selected parts of the coated metal substrate. Flame heating refers to processes where heat is transferred to the object by means of a gas flame without the object melting or material being removed. Laser heating produces local changes at the surface of the material while leaving the properties of the bulk of a given component unaffected. Heat-treating with laser involves solid-state transformation, so that the surface of the metal is not melted. Both mechanical and chemical properties of a coated article can often be greatly enhanced through the metallurgical reactions produced during heating and cooling cycles.

When the coated article is an object of metal, it is also possible to harden the metal of the object during the heat treatment of the coating. Hardening is a metallurgical process used to increase the hardness of a metal. As an example, steel can be hardened by cooling from above the critical temperature range at a rate that prevents the formation of ferrite and pearlite and results in the formation of martensite. Hardening may involve cooling in water, oil or air, according to the composition and size of the article and the hardenability of the steel. The steel must contain sufficient carbon to achieve a useful hardening response.

After a heat treatment carried out at a steel hardening temperature (e.g. 750-1000° C.), the coated metal object can be subjected to annealing or tempering by carrying out a heat treatment at a lower temperature.

Hardening of the metal object can be carried out during the heat treatment of the multilayer coated object even though the metal object has been subjected to hardening before the coating. Good results have been achieved by this kind of further hardening of a coated metal object.

Finally, a dense top layer can be applied on the coated object by thin film deposition, such as physical vapor deposition, chemical vapor deposition or atomic layer deposition. The top layer can consist of a suitable metal, metal alloy, or ceramic, such as titanium nitride or chromium nitride, or diamond like carbon (DLC). The top layer can be deposited on the coated object either before the heat treatments or after them.

After at least one heat treatment the multilayer coating consisting of a plurality of alternating layers of NiP and Cr has good mechanical and physical properties, such as notably high hardness values, improved corrosion and abrasive wear resistance and reduced friction coefficient. Excellent acid resistances have been measured from multilayer coatings produced according to the present invention. Individual layers in a multilayer NiP—Cr coating can be thinner than in a single layer NiP—Cr coating. The new coating can be used to replace conventional decorative or functional (protective) chromium coatings in many embodiments.

The X-ray diffraction spectra (XRD) of the multilayer coatings indicate the presence of crystalline structures of, for instance, nickel, chromium, nickel phosphide ($NiP_3$), heptachromium tricarbide ($Cr_7C_3$), eskolaite ($Cr_2O_3$) and iron oxide ($Fe_{3.776}O_4$) in the heat-treated multilayer coatings according to the present invention. Depending on the heat treatment sequence used, the XRD spectra also indicate the presence of crystalline structures of nickel oxide ($NiO_{0.081}$), chromium carbide ($Cr_3C_2$) or isovite ($Cr_{23}C_6$).

Example 1

The properties of a double-layer coating of NiP—Cr—NiP—Cr were compared with the properties of a single-layer coating of NiP—Cr.

A first test piece was plated with NiP (thickness 8 µm) and Cr (4 µm).

A second test piece was plated with a first layer of NiP (8 µm), a first layer of Cr (4 µm), a strike layer of sulphamate nickel (2 µm), a second layer of NiP (8 µm), and a second layer of Cr (4 µm).

The NiP layers were produced by chemical deposition. The Cr layers were electrodeposited on the NiP layer from a trivalent chromium containing bath.

After coating both test pieces were subjected to similar heat treatment sequences, consisting of first heating step of 30 minutes at 600° C., cooling to room temperature, and second heating step of 60 minutes at 600° C.

The microhardness of the coated test pieces was measured by Vickers hardness test in micro range using an indenter load of 10 g (HV 0.01). The tests were carried out according to EN-ISO 6507.

The sliding wear of the coated test pieces was measured using modified pin-on-shaft sliding wear tests. The measuring device resembles a Pin-On-Disk apparatus with the difference that a rotating shaft is used instead of a rotating disk. The shaft was rotated at a speed of 300 rpm for 15 minutes or 30 minutes. A ball made of $Al_2O_3$ was pressed against the rotating surface with a load of 200×9.81 N or 500×9.81 N. The diameter of the aluminium oxide ball was 6 mm.

The test results are shown in Table 1. The wear values given in Table 1 indicate the depth of the pin wear groove created on the surface under the test conditions.

TABLE 1

| Type of coating | Hardness HV 0.01 | Slid. wear, µm 500 g/30 min | Slid. wear, µm 200 g/15 min |
|---|---|---|---|
| Single NiP—Cr | 2115 | 29 | 5.0 |
| Double NiP—Cr | 2389 | 4.0 | 1.5 |

After heat treatments both the single-layer coating and the double-layer coating had an excellent microhardness higher than 2000 HV 0.01. The microhardness of the double-layer coating was slightly better than the microhardness of the single-layer coating. The double-layer coating also had significantly better sliding wear resistance than the single-layer coating.

Figure 1A:
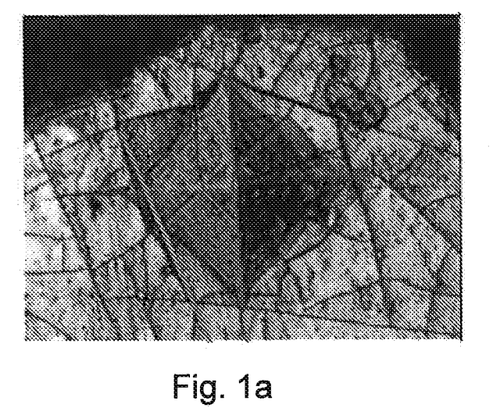
FIG. 1a is a micrograph showing Vickers indentation formed on a single layer coating by a load of 2000 g.
Figure 1B:
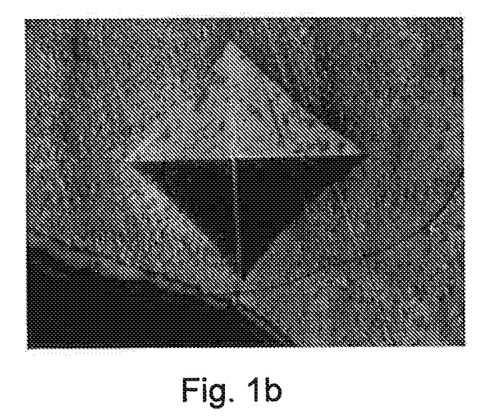
FIG. 1b is a micrograph showing Vickers indentation formed on a multilayer coating according to the present invention.
Figure 1C:
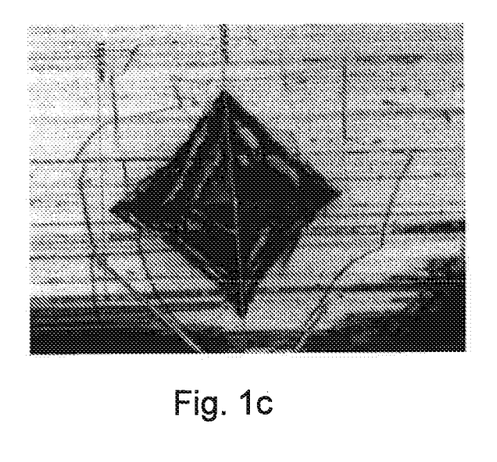
FIG. 1c is a micrograph showing Vickers indentation formed on a commercially available hard chrome coating.

The indentation left in different types of coated surfaces after a Vickers hardness test with a 2000 g load is shown in FIG. 1a-1c. The single-layer coating in FIG. 1a shows a plurality of cracks around the indentation. The double-layer coating in FIG. 1b shows essentially no cracking. A commercial hard chrome coating in FIG. 1c shows widely spread cleavage of coating around the indentation. FIGS. 1a-1c confirm that a multilayer coating is tougher than single-layer coatings.

Example 2

The influence of heat treatment on NiP—Cr multilayer coating was investigated by comparing the properties of a non-heat-treated multilayer coating with a multilayer coating subjected to a two-step heat treatment sequence.

Two test pieces were each plated with following layers: a first NiP layer (thickness 5 µm), a first Cr layer (2 µm), a first nickel strike layer (1 µm), a second NiP layer (7 µm), a second Cr layer (3 µm), a second nickel strike layer (1 µm), a third NiP layer (7 µm), and a third Cr layer (3 µm). The layers of nickel phosphorus alloy were chemically deposited. The chromium layers were electrodeposited from trivalent chromium containing electrolyte bath. The nickel strike layers were electrodeposited from sulphamate nickel bath.

The first test piece was subjected to a heat treatment sequence comprising a first heating step of 30 minutes at 600° C., cooling to room temperature and a second heating step of 60 minutes at 600° C. The second test piece was not at all heat-treated.

The morphology of the multilayer coatings was observed by scanning electron microscopy (SEM). The composition of the coatings was analyzed by energy-dispersive X-ray spectroscopy (EDS) by having an electron beam follow a line in a sample image and generating a plot of the relative proportions of previously identified elements along the spatial gradient.

Figure 2A:
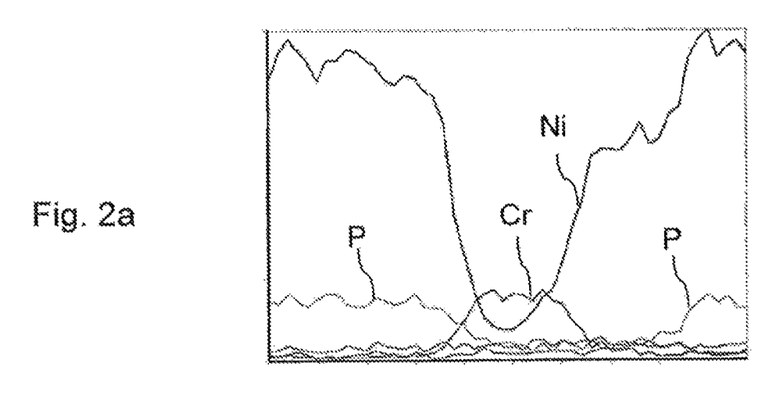
FIG. 2a shows the EDS spectrum of a part of a multilayer coating before heat treatment, taken from the area of the second Cr layer in a coating comprising three sequences of NiP—Cr.
Figure 2B:
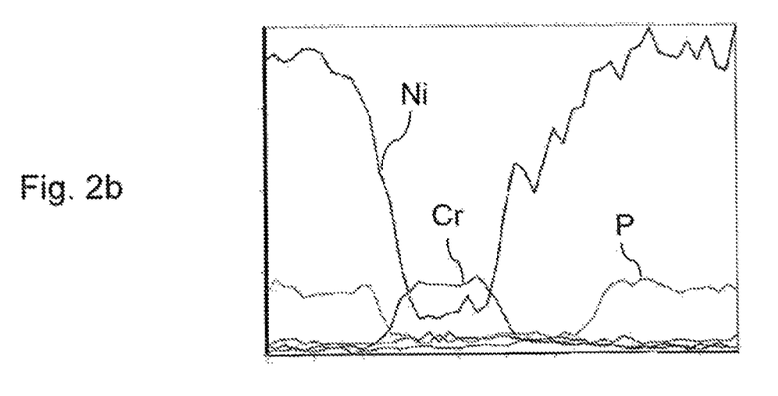
FIG. 2b shows the EDS spectrum of a part of a multilayer coating after one heat treatment.
Figure 2C:
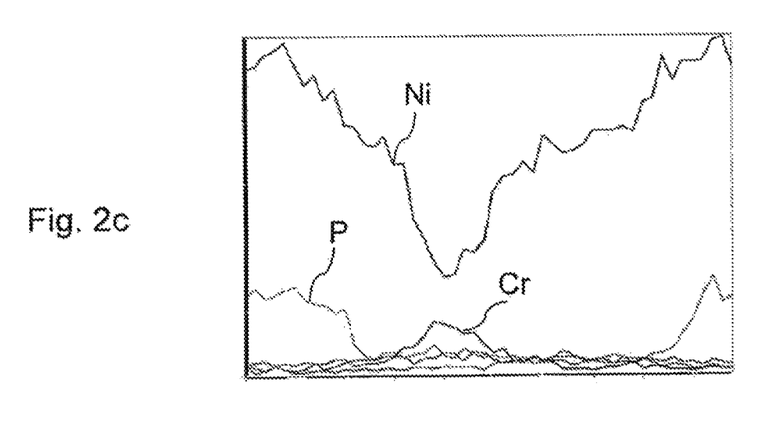
FIG. 2c shows the EDS spectrum of a part of a multilayer coating after two heat-treatments.

FIG. 2a shows the EDS spectrum of a multilayer coating with no heat treatment, FIG. 2b shows the EDS spectrum of a similar coating after one heat treatment step, and FIG. 2c shows the EDS spectrum of a similar coating after two heat treatment steps. Each EDS spectrum indicates the elemental composition of the coating in the area around the second Cr layer, which is located between the second and the third NiP layer. The steel substrate (not shown) is located to the left of the measured area and the surface of the coating (not shown) is to the right of the measured area. EDS spectra were also measured from the area around the first Cr layer located between the first and the second NiP layer.

The EDS analyses verify that two-stage heat treatment of a multilayer coating increases diffusion between subsequent layers of Cr and NiP and disperses boundaries between said layers.

Example 3

Three test pieces of stainless steel were coated with similar multilayer coatings, comprising: a first nickel strike layer (1 µm), a first NiP layer (7 µm), a first Cr layer (5 µm), a second nickel strike layer, a second NiP layer, a second Cr layer, a third nickel strike layer, a third NiP layer, and a third Cr layer.

The first test piece was not heat-treated at all. The second test piece was heat-treated in two steps: a first heating step of 30 minutes at 700° C., cooling, and a second heating step of 30 minutes at 400° C. The third test piece was heat treated as follows: a first heating step of 480 minutes at 700° C., cooling, and a second heating step of 480 minutes at 400° C. In other words, the duration of the heating steps in the third test was 16 times as long as the duration of the heating steps in the second test.

Figure 3A:
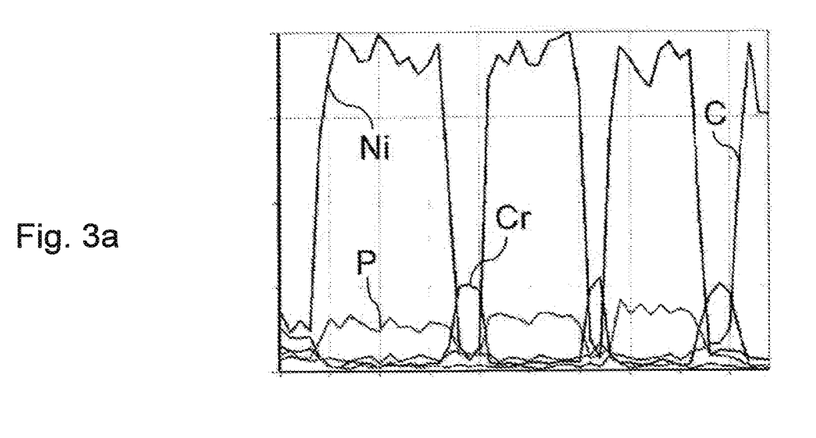
FIG. 3a shows the EDS spectrum of a multilayer coating before heat treatment.
Figure 3B:
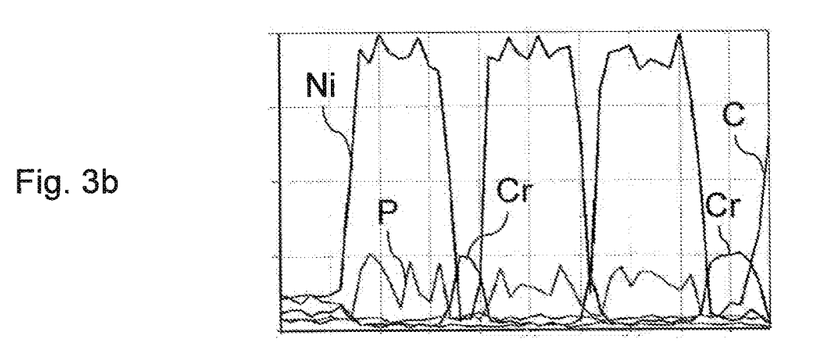
FIG. 3b shows the EDS spectrum of a multilayer coating after two heat treatments.
Figure 3C:
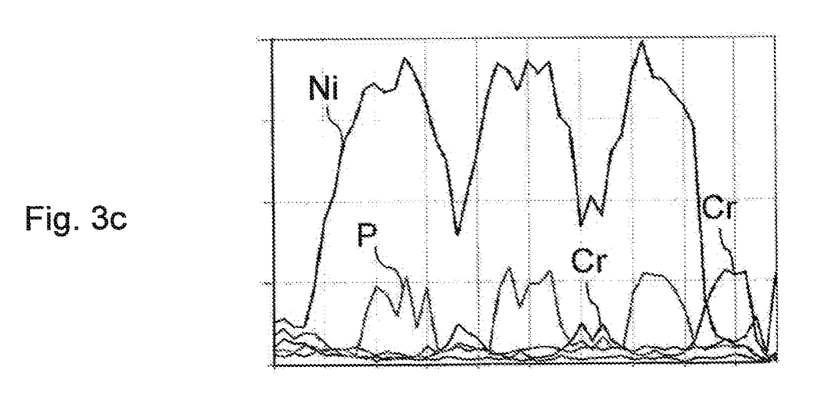
FIG. 3c shows the EDS spectrum of multilayer coating after two extended heat treatments.
Figure 4A:
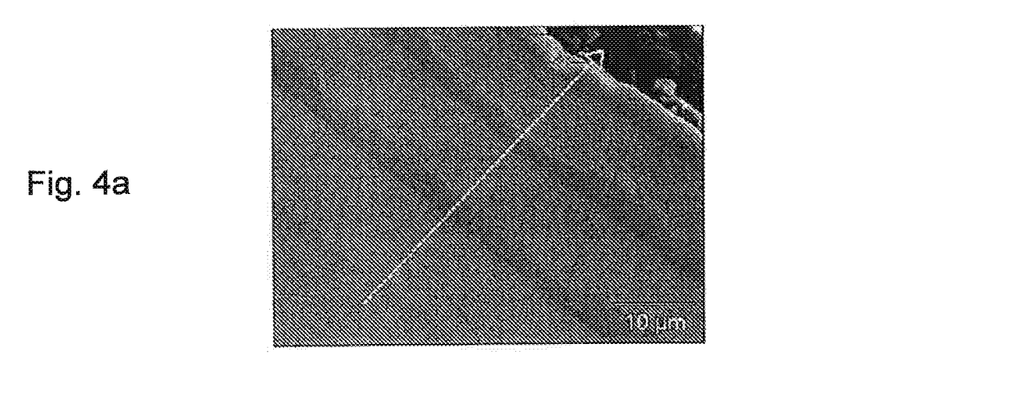
Figure 4B:
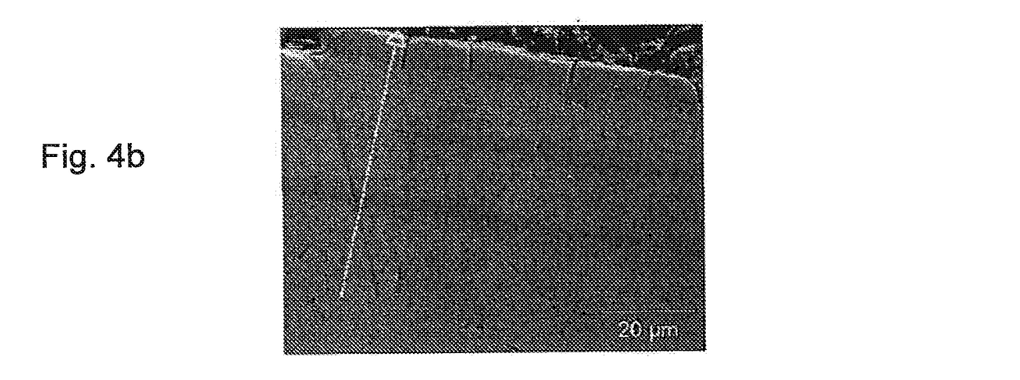
FIG. 4b is a SEM micrograph corresponding to FIG. 3b.
Figure 4C:
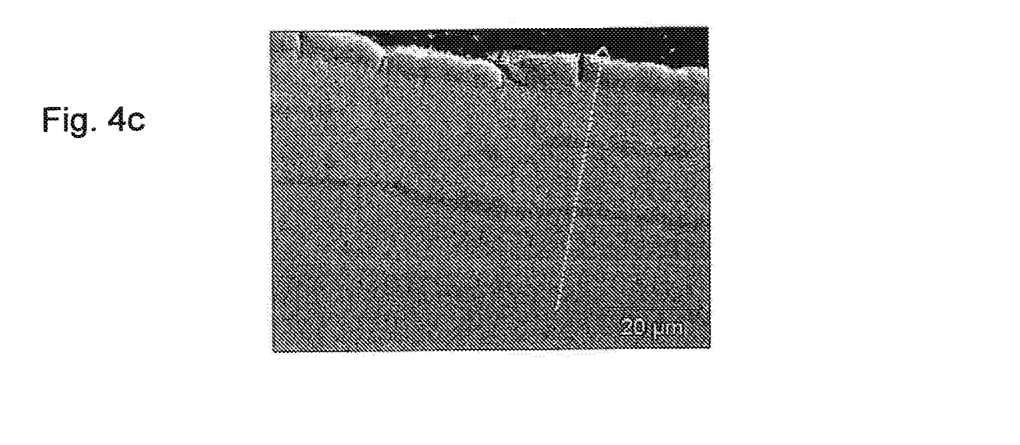
FIG. 4c is a SEM micrograph corresponding to FIG. 3c.

The EDS spectra measured from the coated objects are shown in FIGS. 3a-3c and the SEM micrographs of the same objects are shown in FIGS. 4a-4c. The first test piece (FIGS. 3a and 4a) with no heat treatment shows very clear boundaries between subsequent layers. The second test piece (FIGS. 3b and 4b), which was subjected to normal heat treatments (30+30 minutes), shows increased diffusion between the subsequent NiP and Cr layers, especially in the outermost layers of the coating. The third test piece (FIGS.

3c and 4c) with extended heat treatments (480 min+480 min) shows advanced diffusion between different coating layers.

The X-ray diffraction spectra (XRD) of the heat-treated samples were measured to get information about the crystalline structure of the multilayer coating after heat treatment. Most crystalline materials have unique X-ray diffraction patterns that can be used to differentiate between materials. The peaks of the XRD spectrum were identified by comparing the measured spectrum with the X-ray diffraction patterns of the elements known to be contained in the coating.

The XRD spectrum of the test piece subjected to normal heat-treatments (30 min+30 min) showed peaks that indicate the presence of the crystalline phases of nickel (Ni), chromium (Cr), nickel phosphide ($Ni_3P$), nickel oxide ($NiO_{0.81}$), heptachromium tricarbide ($Cr_7C_3$), eskolaite ($Cr_2O_3$), chromium carbide ($Cr_3C_2$) and iron oxide ($Fe_{3.776}O_4$).

The XRD spectrum of the test piece subjected to extended heat-treatments (480 min+480 min) showed peaks that indicate the presence of the crystalline phases of nickel (Ni), isovite ($Cr_{23}C_6$), chromium (Cr), nickel phosphide ($Ni_3P$), heptachromium tricarbide ($Cr_7C_3$), eskolaite ($Cr_2O_3$) and iron oxide ($Fe_{3.776}O_4$).

The XRD measurements verify the formation of crystalline structures of nickel, chromium, nickel phosphide, chromium carbides and chromium oxides during the heat treatment of the coated object. The measurements also indicate that isovite ($Cr_{23}C_6$) is generated and the amount of eskolaite ($Cr_2O_3$) and nickel phosphide ($Ni_3P$) increases when extending the length of heat treatments from 30 min+30 min to 480 min+480 min.

Example 4

The acid resistance of the multilayer coating manufactured according to the present invention was compared with the acid resistance of conventional hard chrome coatings.

A steel object was coated with three sequences of NiP—Cr (10 μm, 7 μm), after which the coated object was subjected to a first heat treatment of 30 min at 700° C. and a second heat treatment of 30 min at 700° C.

Three test pieces with different types of coating were exposed to 5% sulphuric acid at 100° C. for different time periods. The edges of the test pieces were protected with varnish. The test results are shown in Table 2.

TABLE 2

| Type of coating | Duration min | Mass loss g | Corrosion μm |
|---|---|---|---|
| Hard chrome 1 | 22 | 0.15 | 22 |
| Hard chrome 2 | 2 | 0.18 | 7 |
| Heat-treated multilayer coating | 23 | 0 | 0 |

Surprisingly, the test piece provided with a multilayer coating according to the present invention did not show any corrosion at all after it had been held for 23 minutes in the hot sulphuric acid.

Another test piece with a similar multilayer coating and similar heat treatment was exposed to 35% hydrochloric acid at 20° C. for one hour. The surface topography of the test piece was compared with the surface topography of a conventional hard chrome coated test piece exposed to a similar treatment in hydrochloric acid.

Figure 5A:
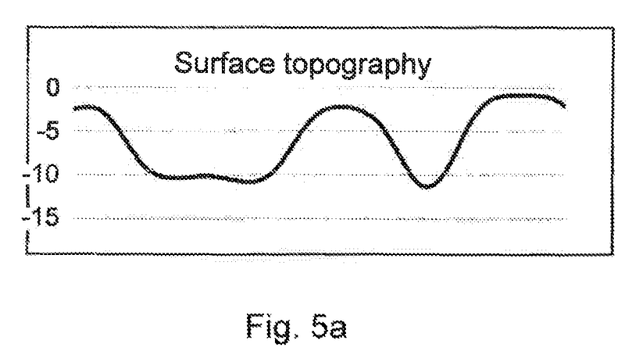
FIG. 5a shows the surface topography of a hard chrome coating after an acid test (HCl).
Figure 5B:
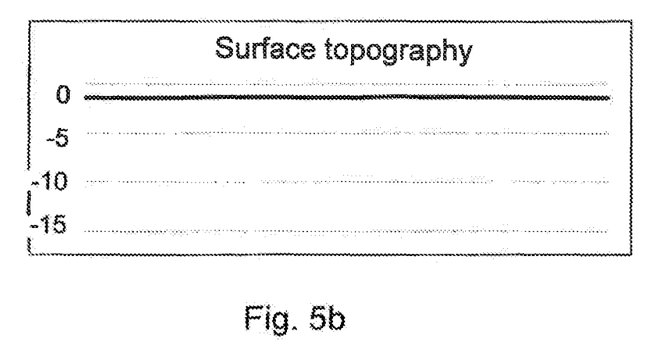
FIG. 5b shows the surface topography of a coating produced according to the present method after an acid test (HCl).

FIG. 5a shows the surface topography of a hard chrome coated object and FIG. 5b shows the surface topography of an object coated according to the present invention.

It was discovered that the test piece with conventional hard chrome coating shows large microscopic cracks, whereas the test piece coated according to the present invention only shows normal microscopic cracks. This indicates that the new coating is able to resist hydrochloric acid corrosion significantly better than conventional hard chrome coating.

Example 5

A surface-hardened metal object was coated with a first strike nickel layer of 1 μm, a first NiP layer of 3 μm, a first Cr layer of 4 μm, a second strike nickel layer of 1 μm, a second NiP layer of 3 μm and a second Cr layer of 4 μm. The total thickness of the coating was about 16 μm. After this the object was heat-treated by induction heating.

First the object was pre-heated by an induction loop with a power of 26 kW and a speed of 1500 mm/min. Then the temperature of the object was raised up to 850° C. by induction with a power of 26 kW and a speed of 1500 mm/min, after which the object was cooled with water jet.

The base material was hardened and the hardness of the coating increased. The Rockwell hardness of the base material after hardening was 58 HRC and the Vickers microhardness of the coating was about 1900 HV.

Example 6

A hardenable metal object was coated with a strike nickel layer of 1 μm, a NiP layer of 3 μm and Cr layer of 4 μm. The total thickness of the coating was about 8 μm. After this the object was heat-treated by induction heating in one step.

The temperature of the object was raised up to 850° C. by induction with a power of 60 kW and a speed of 1500 mm/min, after which the object was cooled with water jet.

The base material was hardened and the hardness of the coating increased. The Rockwell hardness of the base material after hardening was 55 HRC and the Vickers microhardness of the coating was about 1600 HV.

Example 7

An object was coated with a NiP layer of 7 μm and a Cr layer of 5 μm. The coated object was heated at 700° C. for 30 minutes. After this a top layer of diamond like carbon (DLC) was deposited on the coated object by thin film deposition.

The Vickers microhardness of the coating was over 2000 HV. The Pin-on-Disc sliding wear of the coated surface was 0 μm (test duration 210 min, load 500 g and speed 300 rpm). The friction coefficient of the coated surface was 0.24. The AASS corrosion test gave a value of over 200 h.

Alternatively, the top layer could also have been applied directly on the NiP—Cr coating, in which case the heat treatment could have been carried out after the thin film deposition step.

It is obvious to a person skilled in the art that with the advancement of technology, the basic idea of the invention may be implemented in various ways. The invention and its embodiments are thus not limited to the examples described above; instead they may vary within the scope of the claims.

The invention claimed is:

1. A method for producing a chromium-containing multilayer coating on an object, comprising the steps of:

depositing a layer of nickel-phosphorus alloy (NiP) on the object;
electroplating a layer of trivalent chromium on the object;
repeating said steps one or more times in order to produce a multilayer coating containing two or more alternate layers of nickel-phosphorus alloy and chromium; and
subjecting the coated object to one or more heat treatments to amend the mechanical and physical properties of the coating and to produce multiphase layers containing crystalline Ni and crystalline $Ni_3P$ and multiphase layers containing crystalline Cr.

2. A method according to claim 1, wherein at least one of the chromium layers is deposited next to a NiP layer and during the one or more heat treatments at least one multiphase layer is produced that contains crystalline CrNi.

3. A method according to claim 1, wherein the NiP layers are produced by electrodeposition or electroless deposition.

4. A method according to claim 1, wherein the phosphorus content of the nickel phosphorus alloy is 1-15 w %.

5. A method according to claim 1, wherein the phosphorus content of the nickel phosphorus alloy is 3-12 w-%.

6. A method according to claim 1, wherein the phosphorus content of the nickel phosphorus alloy is 5-9 w-%.

7. A method according to claim 1, wherein the temperature in the heat treatments is 200-1000° C.

8. A method according to claim 1, wherein the temperature in the heat treatments is 400-750° C.

9. A method according to claim 1, wherein the one or more heat treatments comprise at least two heat treatments carried out after the desired number of coating layers has been deposited on the object.

10. A method according to claim 1, wherein the one or more heat treatments are carried out at a temperature between 500 and 700° C.

11. A method according to claim 1, wherein the object is a metal object and hardening of the metal of the object is carried out at the same time as the coated object is heat-treated.

12. A method according to claim 11, wherein the object is a steel object and the heat treatment is carried out at a temperature between 750 and 1000° C.

13. A method according to claim 1, further comprising the step of depositing a top layer on the coated and heat-treated object by thin film deposition.

14. A method according to claim 1, further comprising the step of depositing a top layer on the coated object by thin film deposition, before the step of subjecting the coated object to one or more heat treatments.

15. A coated object comprising a chromium-containing multilayer coating produced by the method according to claim 1, the coating comprising multiphase layers containing crystalline Ni and crystalline $Ni_3P$ and multiphase layers containing crystalline Cr.

16. A coated object according to claim 15, further comprising at least one multiphase layer containing crystalline CrNi.

17. A coated object according to claim 15, further comprising at least one intermediate layer consisting of a metal or metal alloy other than NiP or Cr.

18. A coated object according to claim 17, wherein the intermediate layer consists of nickel, copper, or molybdenum, or an alloy containing any of them.

19. A coated object according to any one of claim 15, further comprising a top layer produced by thin film deposition.

* * * * *